Nov. 6, 1962

J. E. McFARLAND 3,063,026

COAXIAL HYBRID JUNCTIONS

Filed May 26, 1960

INVENTOR.
JAMES E. MCFARLAND
BY McGregor & Eisenman
ATTORNEYS

United States Patent Office 3,063,026
Patented Nov. 6, 1962

3,063,026

COAXIAL HYBRID JUNCTIONS

James E. McFarland, Jamaica, N.Y., assignor to The Narda Microwave Corporation, Mineola, N.Y., a corporation of New York Filed May 26, 1960, Ser. No. 31,877
10 Claims. (Cl. 333—10)

The present invention relates to microwave devices and more particularly to hybrid junctions.

A hybrid junction is, basically, a four-terminal device that, when inserted into a microwave transmission line causes power fed into one terminal to divide between second and third terminals, none appearing at a fourth terminal. One previously known device has a casing with a pair of coaxial line-coupling terminals at each end of the device. The terminals of each pair are located on opposite sides of the casing.

In this prior art device, the terminals on one side of the casing are connected by a first strip conductor. The terminals on the other side of the casing are connected by a second strip conductor. The strip conductors and the casing form two strip-above-ground plane transmission lines. The transmission lines are directionally coupled along a quarter wavelength region. A substantially flat coupling response over a band of frequencies can be achieved by adding two quarter wavelength compensating coupling regions at opposite ends of the main coupling region.

If microwave energy is fed to a terminal at one end of the device, it divides between the terminal at the same end of the device on the other side of the casing and the terminal at the other end of the device on the same side of the casing as said one terminal. No energy reaches the remaining terminal. Thus, the outputs produced by the device must be obtained from opposite sides of the casing.

If two units for receiving the outputs are required to be mounted on the same rather than on opposite sides of the casing, the connection to one of the units is more complicated and requires more space than the connection to the other unit. If two quarter wavelength compensating coupling regions are employed, the length and space required for the hybrid device is increased further. Space may be at a premium for some applications.

It is an object of the present invention to provide an improved microwave hybrid junction device.

It is another object to provide a hybrid junction device which is extremely compact and can be connected readily to two output units on the same side of its casing.

Still another object is to provide a compact hybrid junction device having a substantially flat coupling response over a wide frequency range.

A further object is to increase the operating frequency range of a quarter wavelength strip transmission line hybrid junction device without materially increasing its length.

The foregoing and other objects and advantages of the invention, which will become more apparent from the drawings and the detailed description below, are attained by a hybrid junction device having a pair of coupling terminals at each end of a casing. The terminals of each pair are on opposite sides of the casing. A transmission line is cross-connected between the terminal at one end of the device on one side of the casing and the terminal at the other end of the device on the other side of the casing. A second transmission line is cross-connected between the other two coupling terminals. A directional coupling region is provided between the transmission lines.

In one preferred embodiment of the invention, the transmission lines are of the strip-above-ground plane type. The strip conductors are supported so that they are parallel along the directional coupling region. Two of their wide surfaces are directly opposite each other in close enough relationship to achieve a predetermined coupling therebetween. Each strip conductor is provided with transverse end sections that extend in opposite directions for cross-connecting a coupling terminal at one end of the device with a coupling terminal at the other end on the opposite side of the casing. Short compensating coupling regions are provided at both ends of the main coupling region to enhance the flatness of the coupling response.

Referring to the drawings.

Figure 1:
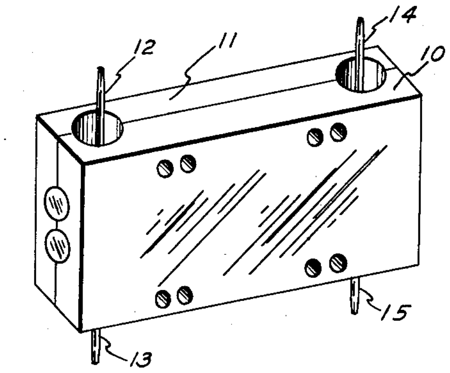
FIGURE 1 is an isometrical view of the hybrid junction device.
Figure 2:
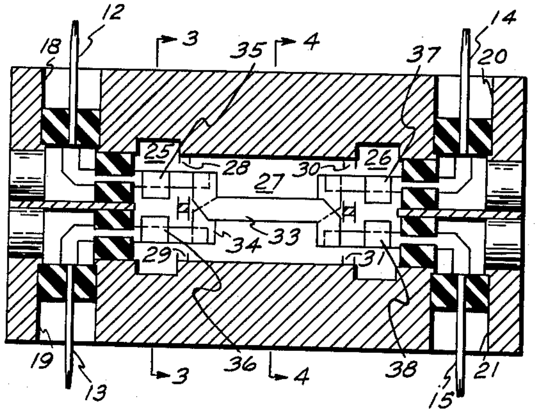
FIGURE 2 is a longitudinal sectional view of the device shown in FIGURE 1.

In the drawings, two rectangularly shaped blocks of metal 10 and 11 are fastened together to form the outer casing of the hybrid junction device. Four L-shaped rod-like conductors 12–15 are supported by dielectric beads in four L-shaped apertures 18–21, respectively, in the casing 10 to form four sections of coaxial transmission line. The ends of conductors 12 and 13 constitute a first pair of coaxial line coupling terminals at one end of the device on opposite sides of the casing. The ends of conductors 14 and 15 constitute a second pair of coaxial line coupling terminals at the other end of the device on opposite sides of the casing. The impedance of each L-shaped section of coaxial line is made uniform along its length in accordance with conventional microwave design techniques.

Figure 3:
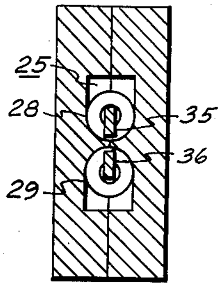
FIGURE 3 is a cross-sectional view of the device taken along the lines 3—3 in FIGURE 2.
Figure 4:
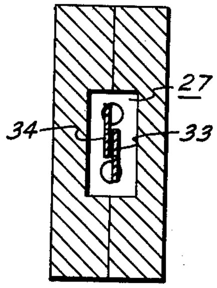
FIGURE 4 is a cross-sectional view of the device taken along the lines 4—4 in FIGURE 2.

The opposing surfaces of the blocks 10 and 11 are machined to provide two end cavities 25 and 26 and an intermediate cavity 27. Each of these cavities has a rectangular cross-section, shown more clearly in FIGURES 3 and 4. The length of cavity 27 along the axis of the device is longer than the length of either of cavities 25 and 26. The height of the cavity 27 is smaller than the height of either of cavities 25 and 26, the widths of the cavities being equal.

The ends of L-shaped conductors 12 and 14 pass through the end cavities 25 and 26, respectively, and are coaxial. The ends of L-shaped conductors 13 and 15 also pass through cavities 25 and 26, respectively, and are coaxial. The conductors 12–15 pass into the intermediate cavity 27 through short, cylindrical, apertures 28–31, respectively, that are machined in the blocks 10 and 11 for joining the intermediate cavity 27 to the end cavities 25 and 26. The cylindrical walls of apertures 28–31 and the portions of conductors 12–15 therein constitute four short sections of coaxial line having substantially the same characteristic impedance as the main coaxial line sections to which they are connected.

The end of the inner conductor 12 is cross-connected to the end of the inner conductor 15 by a strip-like conductor 33 having a rectangular cross-section. End sections of conductor 33 extend transversely in opposite directions for achieving this function. The strip conductor 33 together with the walls of cavity 27, provide a first section of strip-above-ground plane transmission whose microwave impedance equals the impedance of the coaxial lines to which it is connected.

Similarly, a strip-like conductor 34 is provided with transverse end sections that extend in opposite directions for connecting the ends of conductors 13 and 14. The strip conductor 34 together with the walls of cavity 27 provide a further section of strip-above-ground plane transmission line section whose microwave impedance equals the impedances of the coaxial lines to which it is directly connected.

The strip conductors 33 and 34 are supported within cavity 27 so that they are parallel. Two of the wide surfaces of conductors 33 and 34 are spaced apart so as to be directly opposite each other.

The length of each of the strip-above-ground plane transmission lines within cavity 27 is approximately one quarter of an operating wavelength long at the mid-band frequency for the device. Because of the proximity of the parallel portions of strip conductors 33 and 34, the two strip transmission lines are directionally coupled to each other in accordance with principles well known in the art.

Four rectangularly shaped conductive tabs 35–38 are carried by the coaxial line inner conductors 12–15, respectively, within the cavities 25 and 26. The tabs 35 and 36 within cavity 25 extend toward each other to provide a pair of short sections of coupled strip-above-ground plane transmission lines. Similarly, the tabs 37 and 38 extend toward each other to provide another pair of short sections of coupled strip-above-ground plane transmission lines. Each of these lines is short compared to one-eighth of a wavelength at the mid-band operating frequency for the device. The microwave impedance of each line preferably is equal to the section of coaxial line to which it is directly connected.

The conductive tabs 35 and 36 provide a first compensating coupling region on one side of the main directional coupling region within cavity 27. The conductive tabs 37 and 38 provide a second compensating coupling region on the other side of the main directional coupling region. The coefficients of coupling of the compensating coupling regions are equal and less than the coefficient of coupling of the main directional coupling region between strip conductors 33 and 34. The ratio of the coupling coefficients is predetermined for flattening the coupling response of the hybrid junction device over the desired operating frequency band. The center to center spacing between the main coupling region and each of the compensating coupling regions also is predetermined for attaining this result. It has been found that this spacing should be slightly larger than one quarter of a wavelength at the mid band operating frequency and within two or three degrees of 95 degrees to attain the flattest coupling response.

In operation of the hybrid coupler device, input microwave energy is supplied to the coupling terminal at the external end of the conductor 13, for example. As it travels through the device, the energy effectively divides so that outputs appear at the terminals at the external ends of conductors 12 and 14, respectively. These outputs are ninety degrees out of phase and are of equal power if the junction is designed to achieve an equal division of energy. No energy reaches the external end of the conductor 15.

Operated as above, the primary transmission line of the hybrid junction device comprises the conductor 13, conductive tab 36, strip conductor 34, and the conductor 14. The secondary transmission line comprises the conductor 12, conductive tab 35, strip conductor 33 and the conductor 15. The ends of each of these lines are terminated in their characteristic impedance for one application. As microwave energy travels to the right along the primary transmission line, the coupling between lines that occurs within cavities 25–27 causes a wave to be induced in the secondary transmission line that travels to the left only.

The components of the wave induced along the compensating coupling regions effectively subtract from the components of the wave induced along the main coupling region. It has been found that if the ratio of coupling coefficients is chosen properly, the coupling response of the device is substantially flat over a frequency range where the upper operating frequency is twice that of the lower.

Only one mode of operation has been described for the hybrid device, but it will be apparent that other modes are possible, depending upon its application. As is known in the art, a hybrid junction might be used as a balanced crystal mixer, a directional coupler, a duplexer, a power attenuator, or a variable mismatch, phase shifter and power divider. The above described device is especially suited for applications where output units are required to be mounted on the same side of the casing for the device. Also, where it is desired to minimize space and still attain a flat coupling response, the present device is extremely useful.

Although one particular type of strip transmission line and a preferred coupling relationship between two such lines has been illustrated and described, it will be apparent to those skilled in the art that other types of transmission lines known in the art may be employed instead. Furthermore, since other changes might be made in the illustrated embodiment and different words of description could be used without departing from the scope and spirit of the invention, it is to be understood that the invention is limited solely by the appended claims.

I claim:

1. A microwave hybrid junction device comprising a pair of ground-plane conductors, a pair of above-ground-plane conductive members supported between said ground-plane conductors to form two sections of microwave transmission line, a directional coupling region between said conductive members comprising a pair of strip-like conductors of substantially rectangular cross section, the wide surfaces of which are disposed in face-to-face and proximate relationship along the coupling region in two substantially parallel planes, each of said strip-like conductors including end sections extending transversely in opposite directions from the respective strip-like conductors, the end sections at the same ends of said two strip-like conductors also extending in opposite directions, a first pair of coupling terminals at one end of said device on opposite sides of an axis through said coupling region, a second pair of coupling terminals at the other end of said device on opposite sides of said axis, first means for connecting said transversely extending end sections of one of said conductive members to first and second of said terminals, respectively, at the opposite ends of said device on opposite sides of said axis, and second means for connecting said transversely extending end sections of the other of said conductive members to third and fourth of said terminals, respectively, at the opposite ends of said device, on opposite sides of said axis.

2. The device of claim 1 wherein said means for connecting said transversely extending end sections to respective ones of said coupling terminals includes four further sections of transmission line each further transmission line including means for coupling it with an adjacent further section of line along a region that is less than the order of one-eighth of a wavelength long at the mid-band operating frequency for said device, the coefficient of coupling between the first mentioned directional coupling region and each further coupling region and the spacing therebetween being predetermined for flattening the coupling response of said hybrid coupler device.

3. The device of claim 2 wherein each of the said further sections of transmission line comprises a coaxial line whose inner conductor extends beyond the end of its outer conductor and is connected to one of said transversely extending end sections of said strip-like conductors, each extension of said coaxial inner conductors lying between said pair of ground-plane conductors, a conductive tab carried by each extension, the tabs along adjacent extensions being in edge to edge relationship to provide each further coupling region.

4. A hybrid junction device comprising a casing that has a rectangularly shaped cavity with conductive walls, and a pair of strip-like conductive members supported within said cavity in adjacent parallel relationship with their wide surfaces facing each other in close proximity, each of said members having two transverse end sections that extend in opposite directions at substantially right angles thereto, the end sections at the same ends of said members also extending in opposite directions, a first pair of transmission line coupling terminals at one end of said casing on opposite sides thereof, a second pair of transmission line coupling terminals at the other end of said casing on opposite sides thereof, means including the transverse end sections of one of said conductive members for cross-connecting said one member between one set of coupling terminals at opposite ends of said casing on opposite sides thereof, and means including the transverse end sections of the other of said conductive members for cross-connecting the other member between the other set of coupling terminals at opposite ends of said casing on opposite sides thereof.

5. A hybrid junction device comprising a casing that contains a pair of rectangularly shaped end cavities that are separated by a rectangularly shaped intermediate cavity, all cavities being coaxial, a first pair of cylindrically shaped apertures joined to the end of one end cavity, a second pair of cylindrically shaped apertures joined to the end of the other end cavity, the apertures of each pair being on opposite sides of the axis of the cavities, a pair of strip-like conductive members supported within said intermediate cavity, said members together with the walls of said intermediate cavity forming two directionally coupled sections of strip-above-ground plane transmission lines, an inner conductor coaxially supported within each of said cylindrically shaped apertures to form therewith, a section of coaxial line, each inner conductor extending through an end cavity for connection to an end of one of said strip-like conductive members, and a conductive tab carried by each inner conductor within the end cavity through which it passes, the tabs within each end cavity, together with the cavity walls, forming two coupled sections of strip-above-ground plane transmission line.

6. The device of claim 5 wherein the wide surfaces of each of said strip-like conductors face each other.

7. The device of claim 6 wherein transverse conductive extensions are provided at the ends of each strip-like conductive member, the extension at opposite ends of a member connecting the inner conductors at opposite ends of the device on opposite sides of the axis of said cavities.

8. A hybrid junction device comprising a rectangularly shaped block that contains three coaxial cavities of rectangular cross section, the intermediate cavity being longer than the end cavities, a first pair of cylindrical apertures joined to one of said end cavities on opposite sides of the axis of said cavities, a second pair of cylindrical apertures joined to the other of said end cavities on opposite sides of said axis, the apertures on the same side of said axis being coaxial, a pair of strip-like conductors supported within said intermediate cavity to provide a pair of directionally coupled sections of strip-above-ground plane transmission line, an inner conductor coaxially supported in each aperture and extending through an end cavity for connection to an end of one of said strip-like conductors, and a conductive tab carried by each inner conductor within an end cavity for providing a further pair of directionally coupled sections of strip-above-ground plane transmission line on each end of said intermediate cavity.

9. The device of claim 8 wherein the ends of each strip-like conductor are cross-connected between the ends of two of said inner conductors at opposite ends of said device on opposite sides of said cavity axis.

10. The device of claim 9 wherein the intermediate cavity is joined to each end cavity by two cylindrical apertures coaxial with the two inner conductors, respectively, that pass through an end cavity.

References Cited in the file of this patent

UNITED STATES PATENTS

| | | |
|---|---|---|
| 2,860,308 | Bales | Nov. 11, 1958 |
| 2,903,653 | Grantham | Sept. 8, 1959 |
| 2,934,719 | Kyhl | Apr. 26, 1960 |

OTHER REFERENCES

Alford: "A Wide Band Coaxial Hybrid," I.R.E. Convention Record, vol. 4, pt. I, 1956, pages 171–179.